(12) United States Patent
Lee et al.

(10) Patent No.: US 9,041,146 B2
(45) Date of Patent: May 26, 2015

(54) LOGIC CHIP INCLUDING EMBEDDED MAGNETIC TUNNEL JUNCTIONS

(71) Applicant: Intel Corporation, Santa Clara, CA (US)

(72) Inventors: Kevin J. Lee, Beaverton, OR (US); Tahir Ghani, Portland, OR (US); Joseph M. Steigerwald, Forest Grove, OR (US); John H. Epple, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/994,716

(22) PCT Filed: Mar. 15, 2013

(86) PCT No.: PCT/US2013/032151
§ 371 (c)(1),
(2) Date: Jun. 15, 2013

(87) PCT Pub. No.: WO2014/142978
PCT Pub. Date: Sep. 18, 2014

(65) Prior Publication Data
US 2014/0264679 A1 Sep. 18, 2014

(51) Int. Cl.
*H01L 43/02* (2006.01)
*H01L 43/12* (2006.01)
(Continued)

(52) U.S. Cl.
CPC ............... *H01L 43/12* (2013.01); *H01L 43/08* (2013.01); *H01L 27/226* (2013.01)

(58) Field of Classification Search
None
See application file for complete search history.

(56) References Cited

U.S. PATENT DOCUMENTS 6,982,446 B2 * 1/2006 Motoyoshi .................... 257/295
2009/0261433 A1 10/2009 Kang et al.
(Continued)

FOREIGN PATENT DOCUMENTS

KR 10-2010-0094905 8/2010

OTHER PUBLICATIONS

Guangyu Sun; Xiangyu Dong; Yuan Xie; Jian Li; Yiran Chen, "A novel architecture of the 3D stacked MRAM L2 cache for CMPs," High Performance Computer Architecture, 2009. HPCA 2009. IEEE 15th International Symposium on , pp. 239,249, Feb. 14-18, 2009.*

(Continued)

*Primary Examiner* — Joseph Schoenholtz
(74) *Attorney, Agent, or Firm* — Trop, Pruner & Hu, P.C.

(57) ABSTRACT

An embodiment integrates memory, such as spin-torque transfer magnetoresistive random access memory (STT-MRAM) within a logic chip. The STT-MRAM includes a magnetic tunnel junction (MTJ) with an upper MTJ layer, lower MTJ layer, and tunnel barrier directly contacting the upper MTJ layer and the lower MTJ layer; wherein the upper MTJ layer includes an upper MTJ layer sidewall and the lower MTJ layer includes a lower MTJ sidewall horizontally offset from the upper MTJ layer. Another embodiment includes a memory area, comprising a MTJ, and a logic area located on a substrate; wherein a horizontal plane intersects the MTJ, a first Inter-Layer Dielectric (ILD) material adjacent the MTJ, and a second ILD material included in the logic area, the first and second ILD materials being unequal to one another. In an embodiment the first and second ILDs directly contact one another. Other embodiments are described herein.

24 Claims, 9 Drawing Sheets (51) Int. Cl.
 *H01L 43/08* (2006.01)
 *H01L 27/22* (2006.01)

(56) References Cited

U.S. PATENT DOCUMENTS

| | | | |
|---|---|---|---|
| 2009/0291388 A1 | 11/2009 | Assefa et al. | |
| 2009/0302405 A1 | 12/2009 | Gaidis et al. | |
| 2010/0289098 A1* | 11/2010 | Li et al. ........................ | 257/421 |
| 2010/0297820 A1 | 11/2010 | Lee et al. | |
| 2011/0133299 A1* | 6/2011 | Zhu et al. ...................... | 257/421 |
| 2011/0233699 A1* | 9/2011 | Takenaga et al. ............. | 257/421 |
| 2011/0291209 A1* | 12/2011 | Takenaga et al. ............. | 257/421 |
| 2012/0228728 A1* | 9/2012 | Ueki et al. ..................... | 257/421 |
| 2013/0015541 A1 | 1/2013 | Kanaya | |
| 2013/0146996 A1* | 6/2013 | Yu et al. ........................ | 257/421 |
| 2013/0235656 A1* | 9/2013 | Li et al. ......................... | 365/173 |
| 2014/0070344 A1* | 3/2014 | Khalili Amiri et al. ....... | 257/421 |
| 2014/0124883 A1* | 5/2014 | Iwayama ....................... | 257/421 |

OTHER PUBLICATIONS

Weisheng Zhao; Prenat, G.; Klein, J.-O.; Dieny, B.; Chappert, C.; Ravelosona, D., "Emerging hybrid logic circuits based on non-volatile magnetic memories," New Circuits and Systems Conference (NEWCAS), 2013 IEEE 11th International, pp. 1,4, Jun. 16-19, 2013.*

International Search Report and Written Opinion for Application Serial No. PCT/US2013/032151 mailed Dec. 13, 2013.

U.S. Appl. No. 13/994,715 entitled "Logic Chip Including Embedded Magnetic Tunnel Junctions" by Kevin J. Lee, filed Jun. 15, 2013.

* cited by examiner

FIG. 19

LOGIC CHIP INCLUDING EMBEDDED MAGNETIC TUNNEL JUNCTIONS

This application is a §371 national phase of PCT/US2013/32151 filed Jun. 15, 2013, the content of which is hereby incorporated by reference.

TECHNICAL FIELD

Embodiments of the invention are in the field of semiconductor devices and, in particular, logic chips having embedded memory.

BACKGROUND

Integrating memory directly onto a logic chip (e.g., microprocessor chip) enables wider buses and higher operation speeds compared to having physically separate logic and memory chips. Such memory may include traditional charge-based memory technologies such as dynamic random-access memory (DRAM) and NAND Flash memory.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment. Terms such as "upper" and "lower" "above" and "below" may be understood by reference to the illustrated X-Z coordinates, and terms such as "adjacent" may be understood by reference to X-Y coordinates or to non-Z coordinates.

As stated above, integrating memory directly onto a logic chip has advantages. Such memory may include DRAM and NAND Flash memory. However, DRAM and NAND Flash memory have scalability issues related to increasingly precise charge placement and sensing requirements, and hence embedding charge-based memory directly onto a high performance logic chip is problematic at, for example, sub-20 nm technology nodes.

An embodiment includes a logic chip integrated with a memory; however the memory scales to smaller geometries than possible with traditional charge-based memories. In one embodiment the memory is a spin-torque transfer magnetoresistive random access memory (STT-M RAM), which relies on resistivity rather than charge as the information carrier. More specifically, an embodiment includes at least one STT-MRAM memory embedded within a memory layer of a logic chip (e.g., processor). The at least one STT-MRAM memory may include at least one STT-MRAM array having at least one magnetic tunnel junction (MTJ). Other memories besides STT-MRAM, such as resistive RAM (RRAM), are used in other embodiments.

An embodiment integrates a STT-MRAM within a logic chip, where the memory includes a MTJ that has an upper MTJ layer, a lower MTJ layer, and a tunnel barrier directly contacting the upper MTJ layer and the lower MTJ layer; wherein the upper MTJ layer includes an upper MTJ layer sidewall and the lower MTJ layer includes a lower MTJ sidewall horizontally offset from the upper MTJ layer. Another embodiment includes a memory area, comprising a MTJ, and a logic area located on a substrate; wherein a horizontal plane intersects the MTJ, a first Inter-Layer Dielectric (ILD) material adjacent the MTJ, and a second ILD material included in the logic area, the first and second ILD materials being unequal to one another. In an embodiment the first and second ILDs directly contact one another. Other embodiments are described herein.

Figure 1:
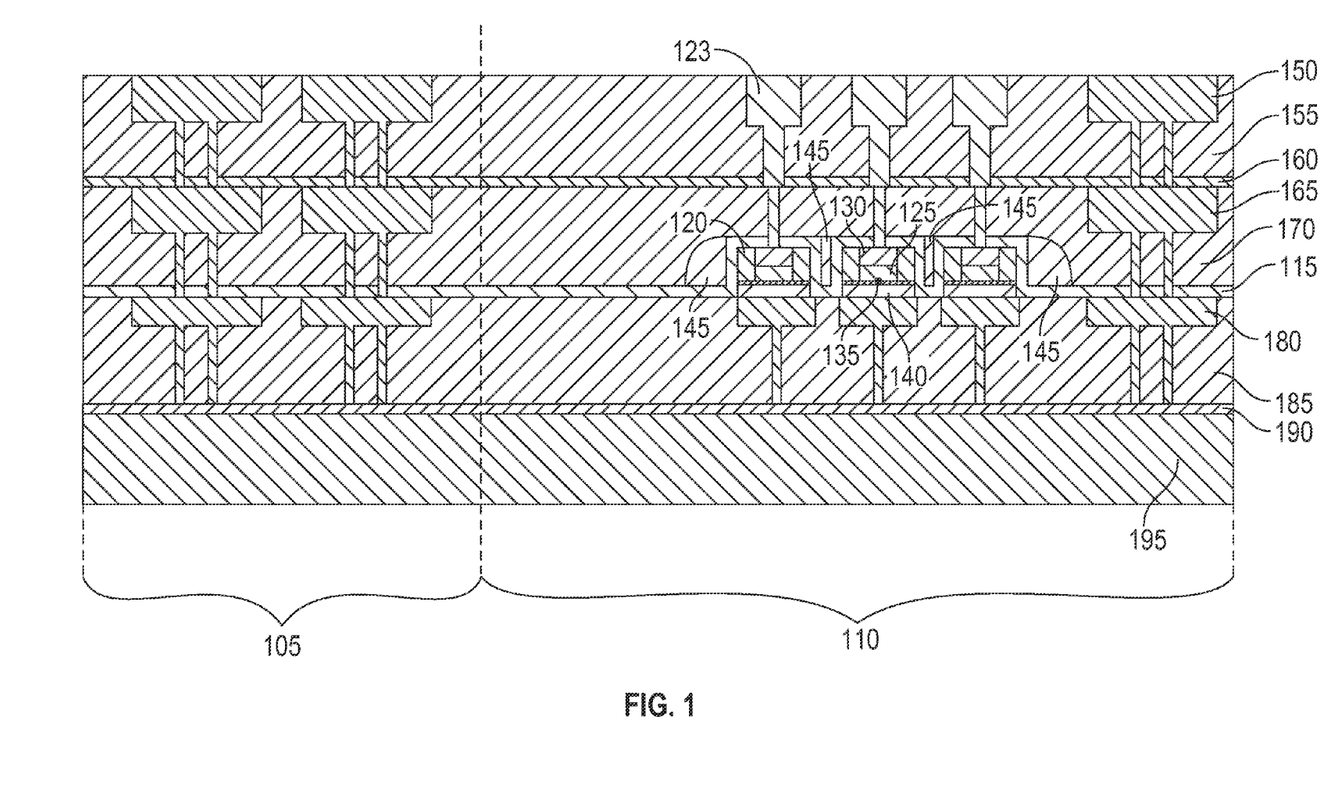
FIG. 1 depicts a logic chip including embedded magnetic tunnel junctions in an embodiment of the invention.

FIG. 1 depicts a logic chip including embedded MTJs in an embodiment. Although MTJs may comprise multiple layers of very thin metal films, for discussion purposes the MTJ film stack is divided into four portions in FIG. 1: "bottom MTJ" 140 (the bottom layer of the MTJ), "tunnel barrier" 135, "top MTJ" 125 (the top layer of the MTJ), and hardmask layer 130. FIG. 1 shows three MTJs all included in M2 metal layer 165. The three MTJs are included on silicon substrate 195 and various build up layers generally represented by layer 190. The three MTJs are shown as being embedded in M2 165 for discussion purposes but could be embedded in other interconnect layers such as metal layers M1 180, M3 150, and the like.

For clarity purposes some details are not labeled in FIG. 1 but those details will become clearer when discussing a manufacturing process for the device of FIG. 1 using FIGS. 2-16. For example, although there are several spacer portions in FIG. 1 possibly only one such portion is labeled for purposes of clarity. However, other portions may be labeled in one or more of FIGS. 2-16.

In the embodiment of FIG. 1 sidewall spacer 120 is located along the edges of patterned hardmask 130 and top MTJ 125 films. Sidewall spacer 120 protects the edges of top MTJ films 125 from oxidation and/or corrosion.

In an embodiment there is horizontal separation between the edges of hardmask 130 and top MTJ 125 films compared to the edges of tunnel barrier 135 and bottom MTJ 140 films. This horizontal separation provides a margin with respect to top MTJ-to-bottom MTJ shorting.

An embodiment includes remnants of etch-stop film 115 on the edges of tunnel barrier 135 and bottom MTJ 140 films. Film 115 protects tunnel barrier film 135 and bottom MTJ films 140 from sidewall oxidation and/or corrosion.

An embodiment retains the same regular low-k ILD material 155, 170, 185 in logic area 105 (e.g., processor) and memory layer 110 that includes embedded MTJs. Doing so helps the embodiment meet stringent RC delay requirements of modern high performance logic chips. However, area 110 also includes flowable oxide layer 145, which provides an ILD not found in area 105 (or at least portions of area 105).

FIG. 1 shows four elements: (1) sidewall spacer 120, (2) horizontal separation between the edges of hardmask 130 and top MTJ 125 films compared to the edges of tunnel barrier 135 and bottom MTJ 140 films, (3) remnants of etch-stop film 115 on the edges of tunnel barrier 135 and bottom MTJ 140 films, and (4) the same regular low-k ILD material 155, 170, 185 in logic area 105 (e.g., processor) and memory layer 110, other embodiments need not include all of these elements. Other embodiments may include any combination or subset of these four elements such as, for example, elements (1) and (2) but not elements (3) and/or (4).

Figure 2:
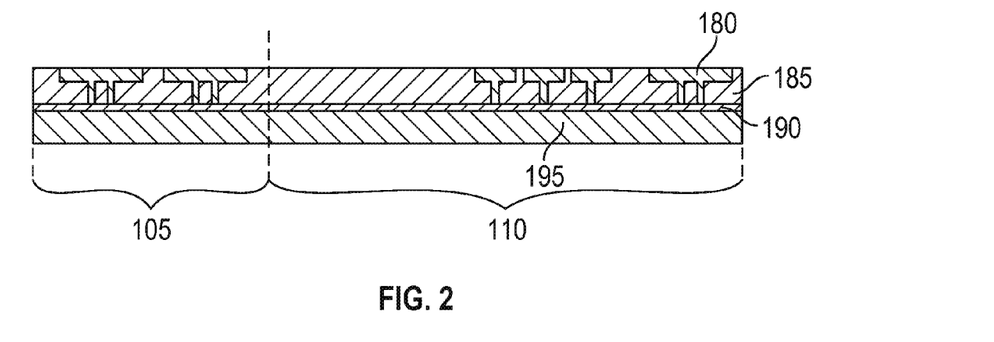
FIGS. 2-16 depict a process for fabricating a logic chip including embedded magnetic tunnel junctions in an embodiment of the invention.

FIGS. 2-16 depict a process for fabricating a logic chip area 105 including an embedded MTJ area 110 in an embodiment of the invention. In FIG. 2 the process sequence begins with wafer 195 on which the topmost surface has a patterned interconnect layer within M1 layer 180. M1 layer 180 is included within ILD 185. For the purposes of discussion the process flow is shown beginning with a wafer having a patterned M1 interconnect on its topmost surface, but the topmost surface could be some other interconnect layer (i.e. M2, M3, M4 and the like). Wafer 195 may also have other back-end and front-end layers 190 beneath the topmost patterned interconnect layers.

Figure 3:
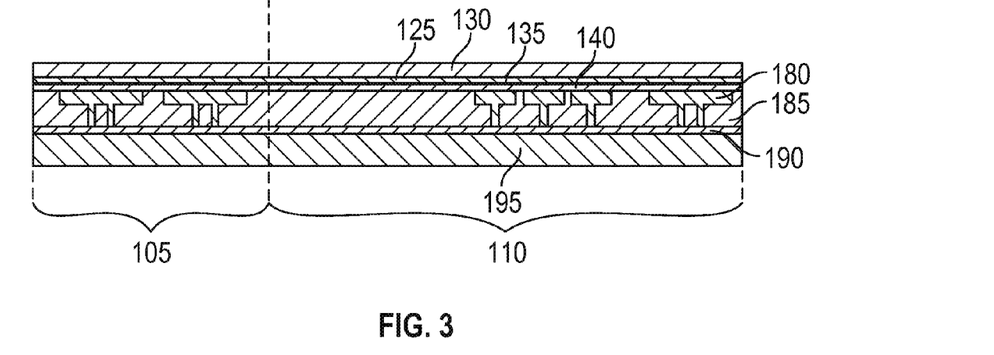

In FIG. 3 the MTJ metal film stack (layers 140, 135, 125) is deposited followed by the deposition of hardmask material 130. In an embodiment the method of depositing the MTJ metal film stack is physical vapor deposition (PVD) sputtering. In an embodiment bottom MTJ film 140 consists of (from bottom to top) 3 nm tantalum (Ta); 20 nm platinum manganese (PtMn); 2.3 nm cobalt iron ($Co_{70}Fe_{30}$); 0.8 nm Ruthenium (Ru); 2.5 nm cobalt iron boron ($Co_{60}Fe_{20}B_{20}$), tunnel barrier 135 includes 1.2 nm magnesium oxide (MgO), top MTJ 125 film includes 2.5 nm $Co_{60}Fe_{20}B_{20}$; and hardmask 130 material includes 50 nm Ta. In such an embodiment the hardmask (1) can be deposited sequentially within the same sputter tool that is used for depositing the MTJ metal film stack, and (2) is conductive. Regarding the sputter tool, since all films in the hardmask, top MTJ, tunnel barrier, and bottom MTJ are sputtered films, all of those films may be deposited sequentially inside one sputter tool without breaking vacuum. An advantage of not breaking vacuum is that the surfaces of the various metal films do not oxidize, and hence there is little to no deterioration of the electrical properties of the MTJ layers. Regarding the conductive nature of the hardmask, as a result of the conductivity of the hardmask the hardmask does not need to be removed later in the flow when an electrical connection needs to be made to the top surface of the MTJ. Other embodiments have other thicknesses for bottom MTJ 140, tunnel barrier 135, and/or top MTJ 125 to alter the MTJ electrical characteristics as desired. Likewise, other materials may be used in bottom MTJ 140, tunnel barrier 135, top MTJ 125, and hardmask 130 to obtain different MTJ electrical characteristics, as desired.

Figure 4:
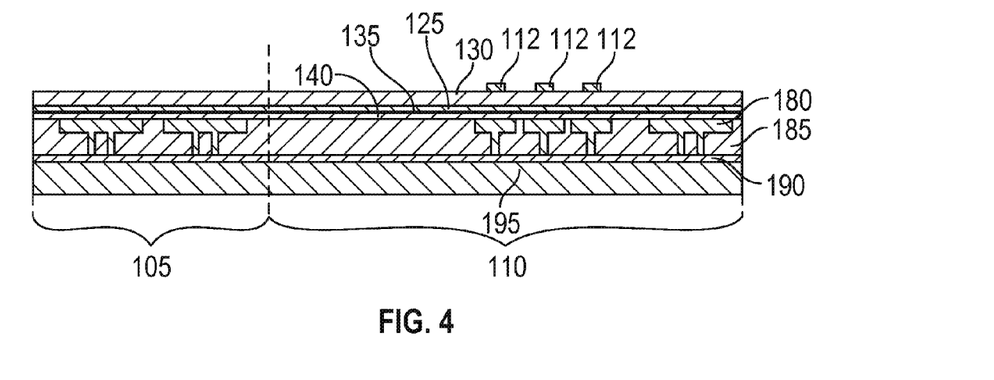

In FIG. 4 resist layer 112 is applied and patterned over those areas of the wafer surface where MTJs are desired (area 110).

Figure 5:
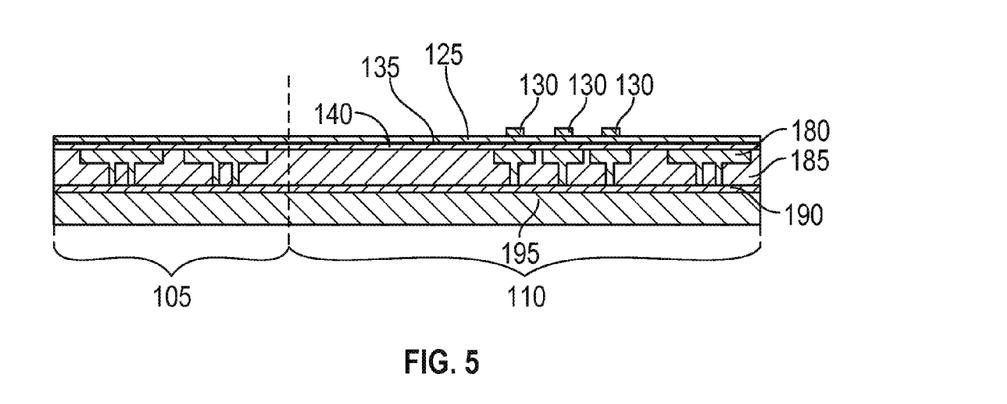
Figure 6:
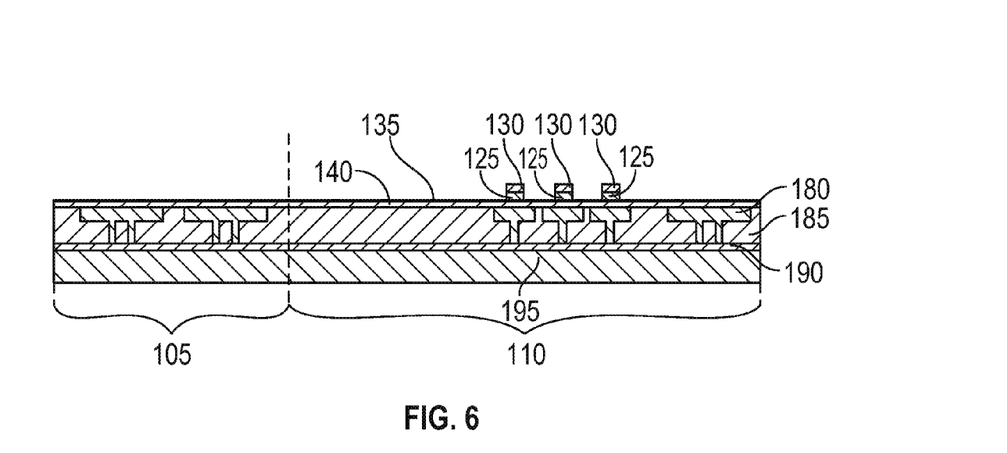
Figure 7:
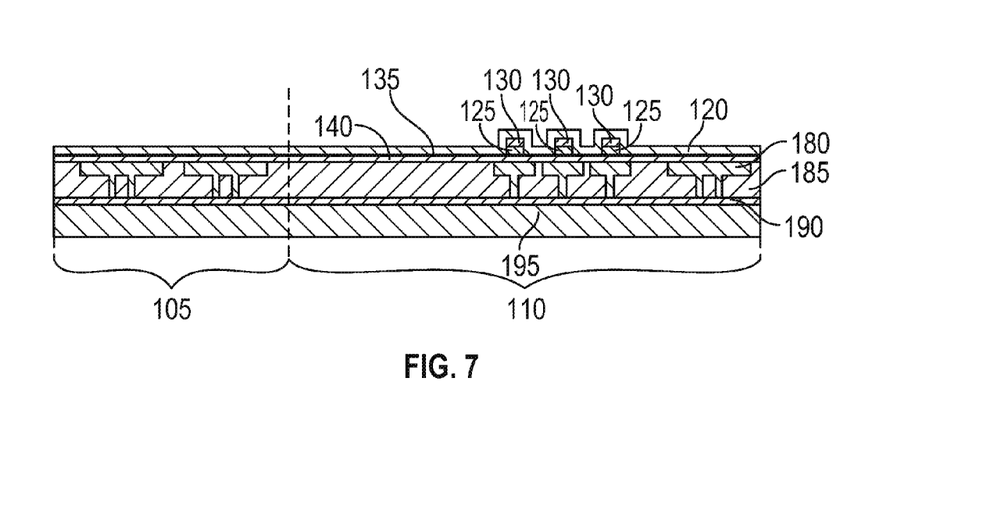
Figure 8:
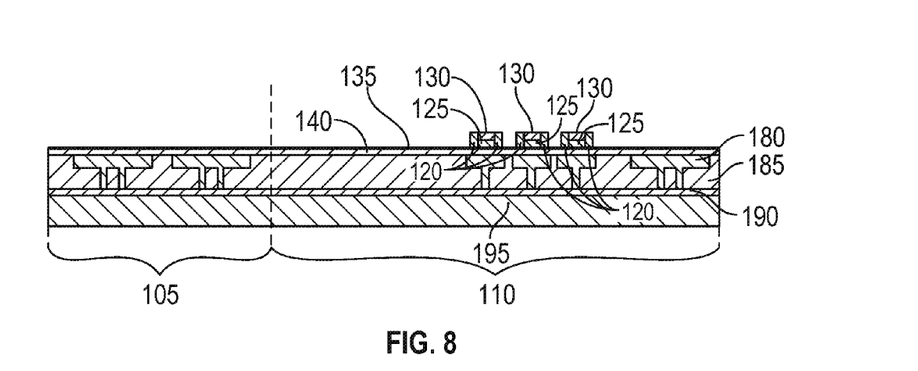
Figure 9:
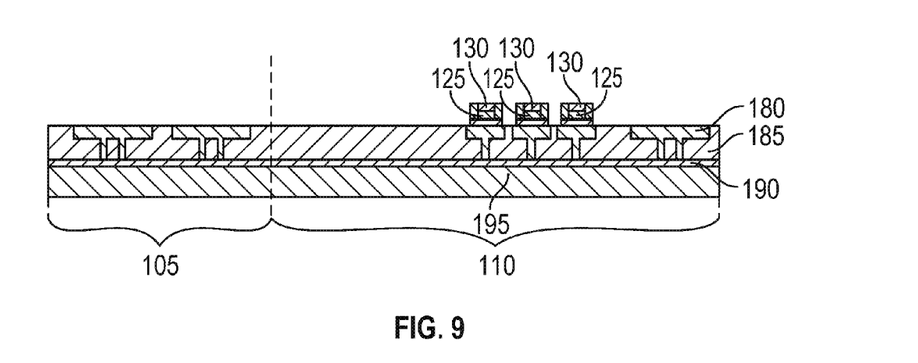
Figure 10:
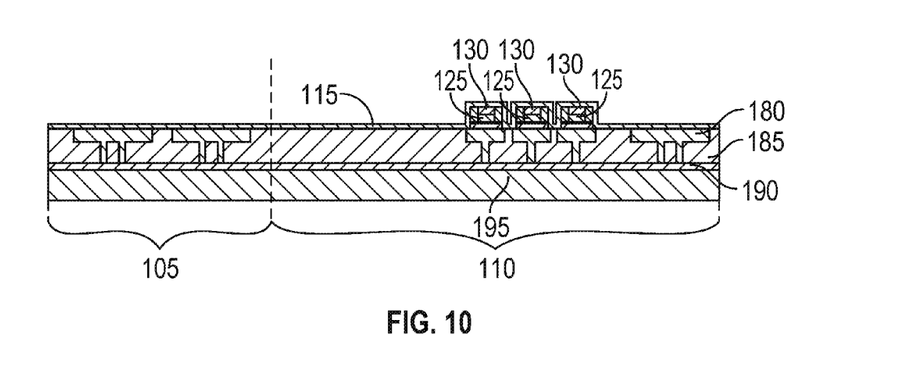

In FIG. 5 exposed hardmask 130 material is etched using, for example, dry etch techniques and any remaining resist is removed using, for example, a plasma ash process. In FIG. 6, top MTJ film 125 is etched using, for example, RIE dry etch techniques, stopping at tunnel barrier 135 material. In FIG. 7 the wafer surface is covered with "spacer" 120 film, such as, for example, silicon nitride, silicon oxide, silicon oxynitride, silicon carbide, or carbon doped silicon nitride. In FIG. 8 an anisotropic dry etch process is used to remove spacer 120 material from all of the horizontal surfaces of the wafer while leaving the spacer material on the vertical sidewalls. In FIG. 9 tunnel barrier 135 and bottom MTJ films 140 are etched using, for example, RIE dry etch techniques, stopping on the underlying M1 180 interconnect and/or ILD 185 materials. In FIG. 10 the wafer surface is covered with etch-stop material 115, such as silicon nitride or silicon carbide. Note that film 115 acts as a flowable oxide etch stop, and it protects the etched sidewalls of the tunnel barrier and bottom MTJ films from oxidation/corrosion.

In one embodiment the processes corresponding to FIGS. 5-10 occur in-situ in a large cluster tool without breaking vacuum in order to minimize any chance of oxidation or corrosion of the etched MTJ sidewalls.

Figure 11:
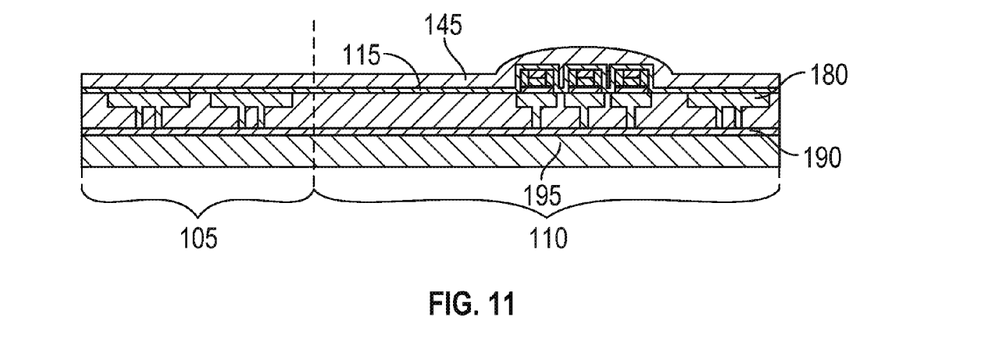

In FIG. 11 the wafer surface is covered with flowable oxide material 145, which may fill any gaps between MTJs. In one embodiment flowable oxide material 145 may include polymer hydrogen silsesquioxane (HSQ) solution in methyl isobutyl ketone (MIBK), but other embodiments are not so limited.

Figure 12:
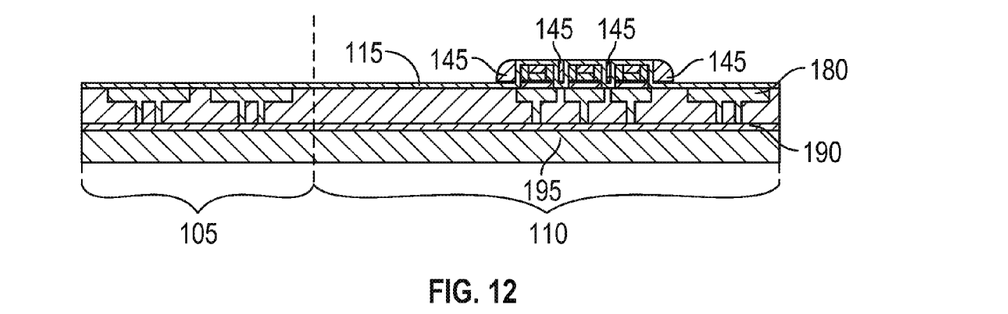

In FIG. 12 flowable oxide 145 overburden is removed using, for example, a dry etchback process. In an embodiment flowable oxide material 145 remains in the gaps between the MTJs.

Figure 13:
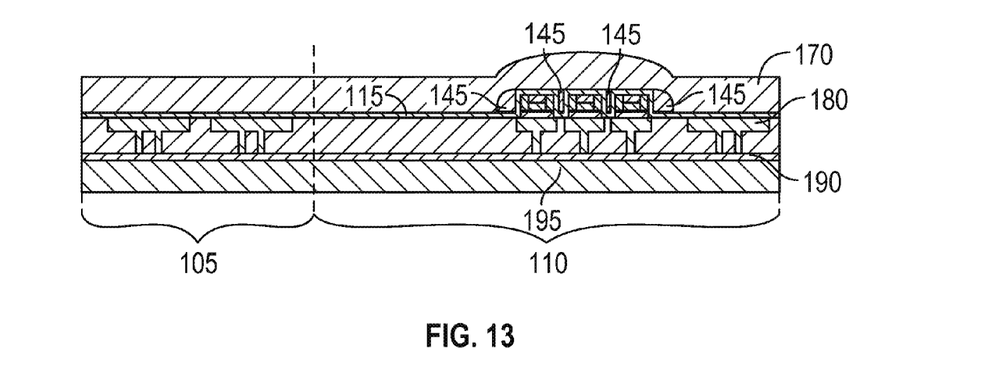

In FIG. 13 low-k ILD material 170 is deposited. In an embodiment, ILD material 170 will ultimately remain in the area of the wafer where the logic circuits are located (area 105). Areas 105, 110 may be identified in a variety of ways. For example, area 110 may include a STT-RAM bit cell array where MTJs are visible and a fairly regular bit cell transistor layout is present. In contrast, the transistor layout in area 105 is not so regular (e.g., not included in a repetitively structured array as is the case with memory) and few to no MTJs are present. ILD 170 satisfies various technical requirements for ILD material(s) used in the corresponding interconnect layer of area 105. Such technical requirements may concern, for example, electrical properties (e.g., dielectric constant, breakdown voltage) and/or mechanical properties (e.g., modulus, toughness, film stress) dictated by design concerns for area 105. In various embodiments etch-stop materials include, for example, silicon nitride, silicon carbide, carbon-doped silicon nitride, and the like. ILD material 170 may be any ILD material whose properties are suitable for use in the logic circuits and interconnect layer of area 105. Embodiments include ILD materials such as, for example, silicon oxide, fluorinated silicon oxide (SiOF), and carbon-doped oxide.

Figure 14:
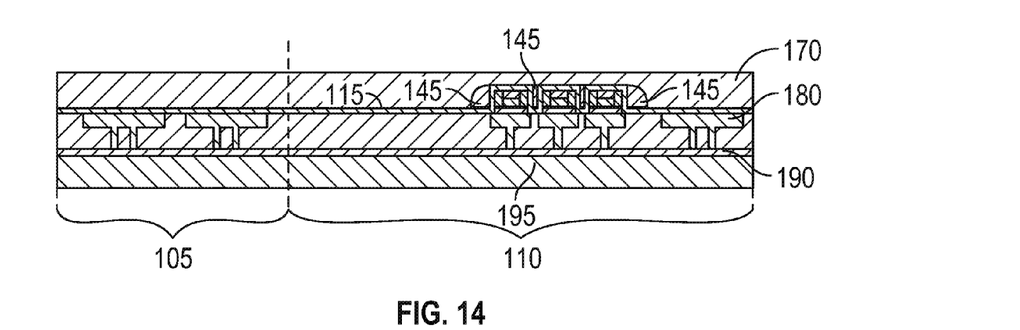
Figure 15:
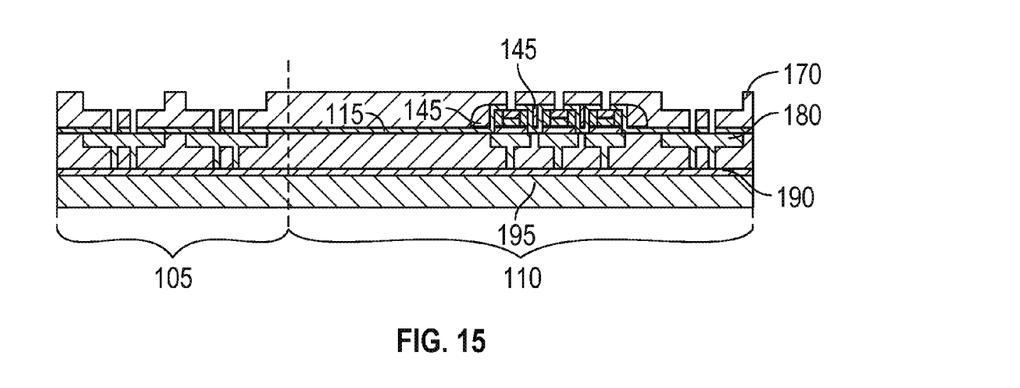
Figure 16:
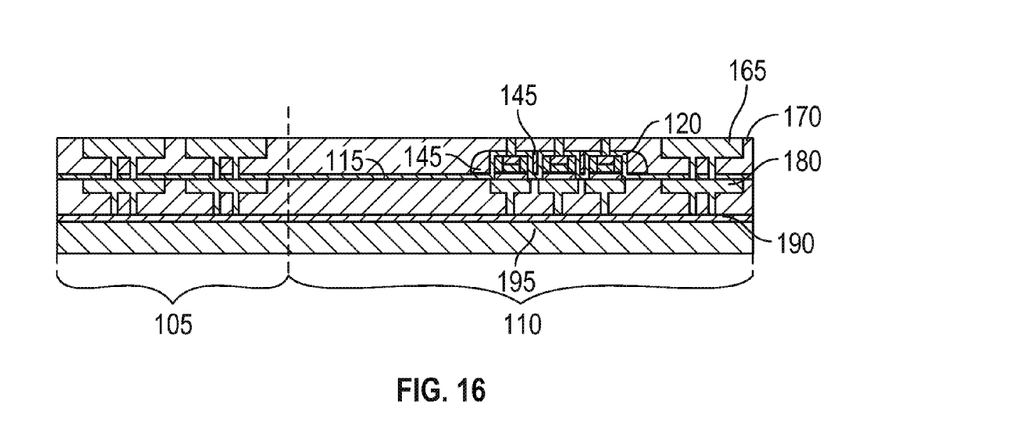

In FIG. 14, the low-k ILD film 170 is planarized (polished). In FIG. 15 trenches and via openings are fabricated into low-k ILD material 170 using, for example, dual damascene patterning. In FIG. 16 copper interconnect structures are formed inside the trenches and via openings using, for example, dual damascene barrier/seed deposition, copper electroplating, and copper CMP processes.

The process then produces the device included in FIG. 1, wherein subsequent etch stop 160 is formed and copper interconnect layer(s) 123 are formed in M3 layer 150. Furthermore, ILD layer(s) 155 are formed, as desired, using, for example, dual damascene process techniques.

Figure 18:
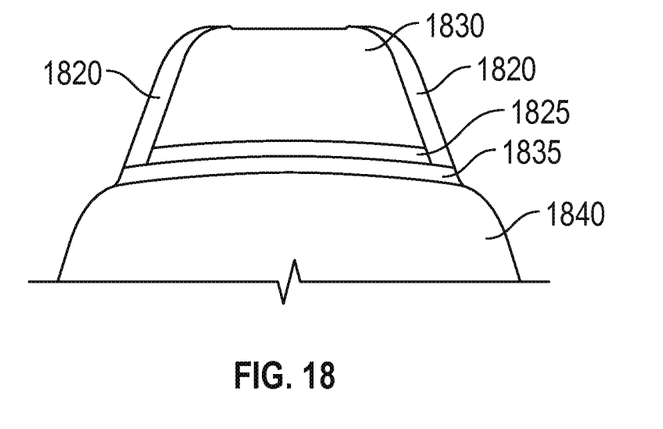
FIG. 18 depicts a magnetic tunnel junction in an embodiment of the invention.

FIG. 18 includes a less idealized version of a portion of FIG. 1. In FIG. 18 tunnel barrier 1835 is located between bottom MTJ layer 1840 and top MTJ layer 1825. Spacer 1820 is vertically adjacent layer 1835 and horizontally adjacent layer 1825 and hardmask 1830.

Another embodiment utilizes a different process and end product. The process and embodiments of FIGS. 2-10 are used. However, going forward from the product of FIG. 10 the process differs. At that point a low-k ILD material is deposited onto the wafer to a thickness in the logic areas approximately equal to that of the height of the MTJ's, followed by a hardmask film. This ILD material occupies the area of the wafer where the logic circuits are located (e.g., a processor in area 105) and consequently includes the properties for an ILD material used in the logic circuits at that specific interconnect layer. Suitable ILD materials include, for example, silicon oxide, SiOF, and carbon-doped oxide. Suitable hardmask films include, for example, titanium nitride and silicon nitride.

Next, a resist layer is applied and patterned to mask off logic circuit area 105 from area 110 where MTJs are located. The exposed hardmask layer is etched, stopping on the low-k ILD film, and then the exposed low-k ILD material is etched, stopping on the underlying etch-stop film (layer 175). The hardmask and low-k ILD films are etched using, for example, dry etch process techniques. Then the resist residue is removed.

Afterwards, the wafer surface is covered with a flowable oxide material (material 145), which fills the gaps in between the MTJs. Flowable oxide overburden is then removed using, for example, an oxide CMP process that selectively stops on the underlying etch-stop material which was formed at the beginning of this alternative method. The flowable oxide material remains inside the gaps in between the MTJs.

Figure 17:
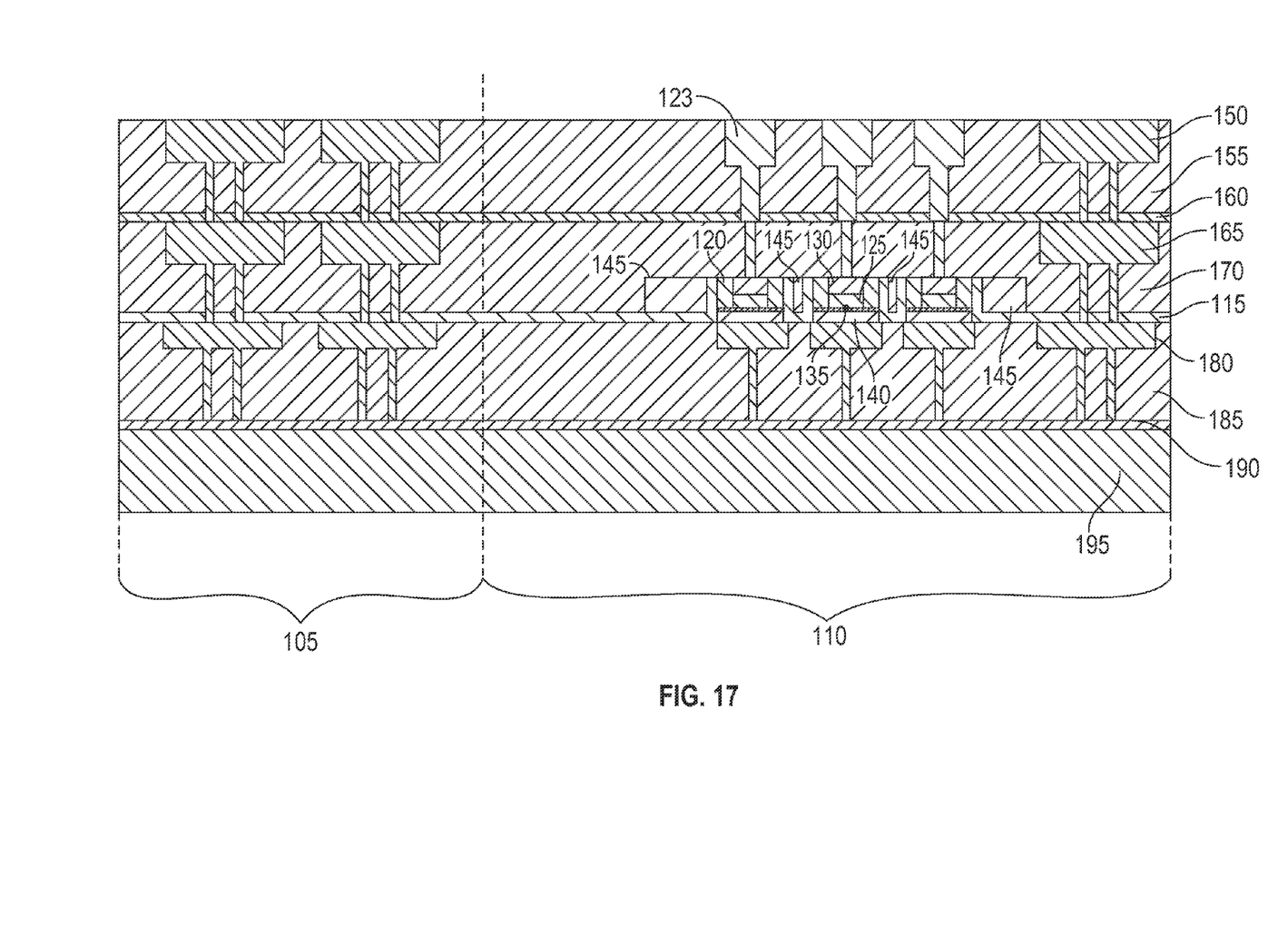
FIG. 17 depicts a logic chip including embedded magnetic tunnel junctions in an embodiment of the invention.

Next the exposed etch-stop material is removed using, for example, a wet or dry etch process (depending on the film composition). Additional low-k ILD material is deposited onto the wafer, such that the total low-k ILD thickness is built up to the value desired for forming the regular interconnect structures in the logic circuit area (area 105). This value is highly variable and depends on, for example, which metal layer the MTJs are integrated into. In one embodiment, the total low-k ILD thickness may be between 30-750 nm, including 50, 100, 200, 300, 400, 500, 600, 700 nm thicknesses. Trenches and via openings are then fabricated into the low-k ILD material using, for example, dual damascene patterning and etching techniques. Copper interconnect structures are then formed inside the trenches and via openings using, for example, dual damascene barrier/seed deposition, copper electroplating, and copper CMP processes. Subsequent copper interconnect layer(s) are formed, as desired, using dual damascene process techniques. FIG. 17 includes a product resultant from the alternative embodiment. FIG. 17 is similar to FIG. 1, however certain flowable oxide portions 145 have a different shape and etch stop 115 no longer "wraps" over portions of the MTJs.

Although the alternate embodiment has more total process steps compared to the embodiment of FIGS. 2-16, the alternate embodiment avoids the low-k ILD polish process (see FIG. 14).

In an embodiment an incoming wafer may include patterned copper interconnects fabricated using standard copper damascene processing (e.g., FIG. 2). In such a case the entire wafer surface is planar. In some embodiments the MTJ film stack (e.g., FIG. 3) is opaque to a scanner alignment system and there may be no alignment "feature" for the scanner to align the MTJ pattern to the prior layer on the wafer. In such a case an additional masking layer may be used to create a scanner alignment mark in the scribe area for aligning the MTJ resist pattern to the underlying substrate (FIG. 4).

Accordingly, various processes have been addressed above, any of which may result in the embodiment of FIG. 1.

Various embodiments (e.g., FIGS. 1 and 17) depict a cross-section of a device having: (a) different ILD materials in the logic area as opposed to the MTJ array area. For example, a single horizontal plane intersects the 3 MTJs, ILD 170, as well as ILD portions in logic area 105. The ILD portions in logic area 105 may include ILD materials different from that of ILD 170 located in area 110. For example, the ILD portions in logic area 105 may include silicon oxide ILD materials and the ILD portions in MTJ area 110 may include flowable oxide. However, in other embodiments the ILD materials may be the same.

Various embodiments (e.g., FIGS. 1 and 17) depict a cross-section of a device having: (b) presence of a sidewall spacer on the edges of the patterned hardmask and/or top MTJ films. For example, there are 3 MTJs shown in FIG. 1. The top MTJ layer 125 for each of the MTJs is located adjacent two vertical spacer portions (sidewall spacers). These sidewall spacers are also adjacent and on the edge of the hardmask portions that are atop the 3 MTJs. However, in other embodiments the spacers may be directly adjacent and contacting only one of the top MTJ and hardmask layers.

Various embodiments (e.g., FIGS. 1 and 17) depict a cross-section of a device having: (c) horizontal separation between the edges of the top MTJ films compared to the edges of the tunnel barrier and the bottom MTJ films. For example, for each MTJ the overall horizontal width of the top MTJ layer is less than the overall width of the corresponding tunnel barrier and/or the overall horizontal width of the top MTJ layer is less than the overall width of the corresponding bottom MTJ layer. The differential between the width of the tunnel barrier and top MTJ layer is equal to the width of the two spacer sidewalls. The differential between the width of the bottom MTJ layer and top MTJ layer is equal to the width of the two spacer sidewalls. In some embodiments the bottom MTJ layer and the tunnel barrier have the same widths for some or all MTJs but in other embodiments they are not the same for some or all MTJs.

Various embodiments (e.g., FIGS. 1 and 17) depict a cross-section of a device having: (d) remnants of the etch-stop film on the edges of the tunnel barrier and bottom MTJ films. For example, there are 3 MTJs shown in FIG. 1. The tunnel barrier and/or bottom MTJ layer 140 for each of the MTJs is located adjacent and directly contacting etch stop portions. The etch stop portions may be vertical portions. These vertical etch stop portions may also be adjacent portions of vertical sidewall spacers.

Embodiments may have various combinations such as any combination of the immediately aforementioned elements (a), (b), (c), and/or (d).

As used herein a layer may have sublayers. For example, a top MTJ layer may actually be composed of many sublayers.

For example and as explained above, in one embodiment MTJ film 140 consists of (from bottom to top) 3 nm tantalum (Ta); 20 nm platinum manganese (PtMn); 2.3 nm cobalt iron ($Co_{70}Fe_{30}$); 0.8 nm Ruthenium (Ru); 2.5 nm cobalt iron boron ($Co_{60}Fe_{20}B_{20}$). Thus, 5 sublayers are included in MTJ film 140. Tunnel barrier 135 includes 1.2 nm magnesium oxide (MgO) but in alternative embodiments layer 135 may include one or more sublayers. Top MTJ 125 film includes 2.5 nm $Co_{60}Fe_{20}B_{20}$ but in alternative embodiments the layer may include one or more sublayers. Hardmask 130 material includes 50 nm Ta but in alternative embodiments the layer may include tantalum nitride, titanium and titanium nitride and/or one or more sublayers. For example, an embodiment may include a top MTJ film with sublayers (1.7 nm Co60Fe20B20/5 nm Ta/5 nm Ru), a tunnel barrier (0.85 nm MgO), and a bottom MTJ film with sublayers (5 nm Ta/1 nm Co60Fe20B20). Another embodiment may include a top MTJ film with sublayers (1.0-1.7 nm Co60Fe20B20/5 nm Ta/5 nm Ru), a tunnel barrier (0.85-0.9 nm MgO), and a bottom MTJ film with sublayers (5 nm Ta/10 nm Ru/5 nm Ta/1.0-1.3 nm $Co_{60}Fe_{20}B_{20}$). Another embodiment may include a top MTJ film with sublayers (CoFeB), a tunnel barrier (MgO), and a bottom MTJ film with sublayers (PtMn/CoFe/Ru/CoFeB). Another embodiment may include a top MTJ film with sublayers (CoFeB(3 nm)/Ru(7 nm)/Cu(110 nm)/Ru(2 nm)/Ta(10 nm) or CoFeB(3 nm)/Ta(8 nm)/Ru(7 nm)), a tunnel barrier with sublayers (Mg(0.4 nm)+MgO(0.6 nm)), and a bottom MTJ film with sublayers (Ta(5 nm)/CuN(20 nm)/Ta(10 nm)/PtMn(15 nm)/CoFe(2.5 nm)/Ru(0.8 nm)/CoFeB(3 nm)). Many other examples are possible and understood to those of ordinary skill in the art and are not described herein for purposes of brevity.

Figure 19:
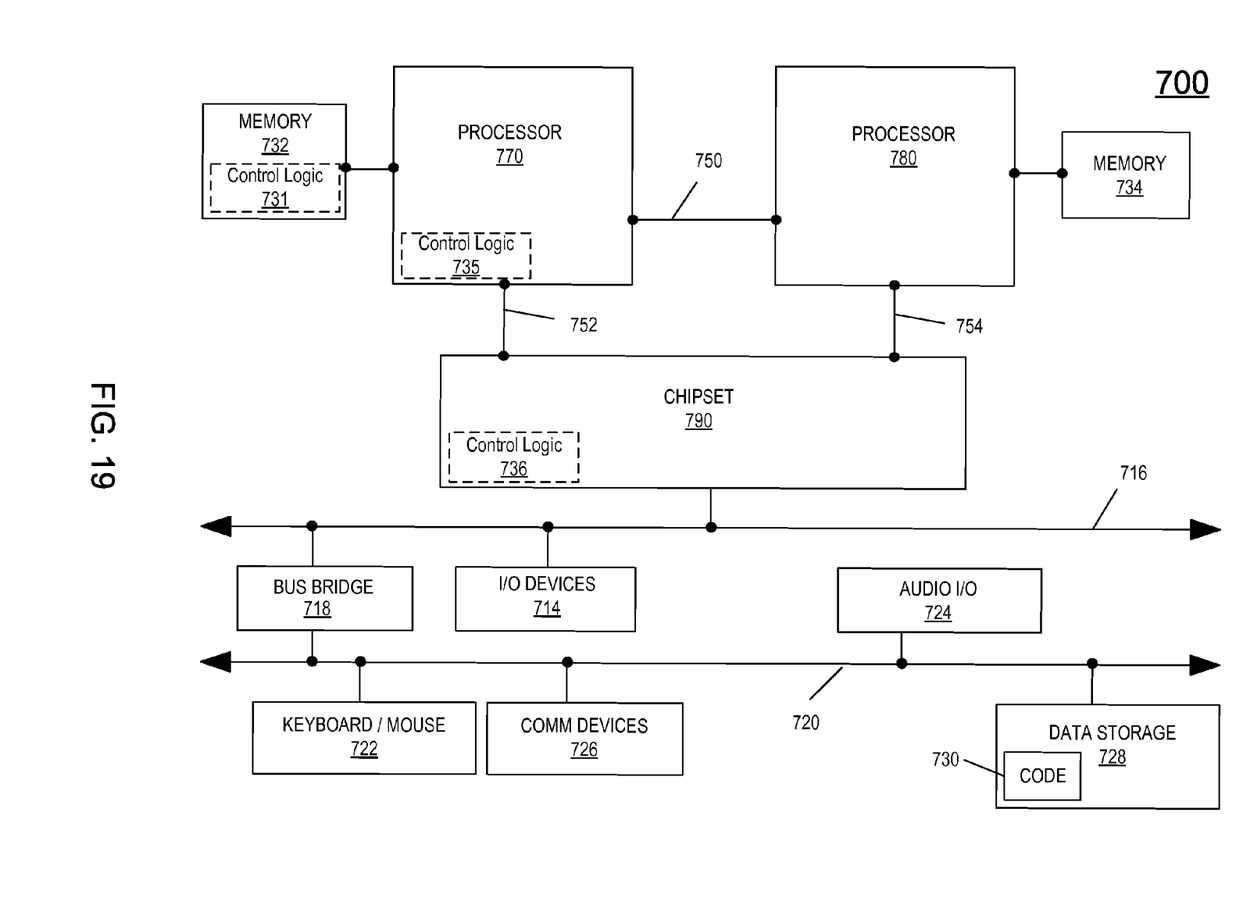
FIG. 19 depicts a system for use with embodiments of the invention.

Embodiments may be used in many different types of systems. For example, in one embodiment a communication device (e.g., cell phone, Smartphone, netbook, notebook, personal computer, watch, camera) can be arranged to include various embodiments described herein. Referring now to FIG. 19, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors. First processor 770 may include a memory controller hub (MCH) and point-to-point (P-P) interfaces. Similarly, second processor 780 may include a MCH and P-P interfaces. The MCHs may couple the processors to respective memories, namely memory 732 and memory 734, which may be portions of main memory (e.g., a dynamic random access memory (DRAM)) locally attached to the respective processors. However, the processors may be located on the same chip as memory as described herein. First processor 770 and second processor 780 may be coupled to a chipset 790 via P-P interconnects, respectively. Chipset 790 may include P-P interfaces. Furthermore, chipset 790 may be coupled to a first bus 716 via an interface. Various input/output (I/O) devices 714 may be coupled to first bus 716, along with a bus bridge 718, which couples first bus 716 to a second bus 720. Various devices may be coupled to second bus 720 including, for example, a keyboard/mouse 722, communication devices 726, and data storage unit 728 such as a disk drive or other mass storage device, which may include code 730, in one embodiment. Code may be included in one or more memories including memory 728, 732, 734, memory coupled to system 700 via a network, and the like. Further, an audio I/O 724 may be coupled to second bus 720.

Notably, at times herein "top MTJ" and "bottom MTJ" layers are used for purposes of explanation, however, a MTJ can be "inverted" making the top layer into the bottom layer (i.e., changing the viewing perspective) without deviating from innovative concepts of embodiments described herein.

As a further example, at least one machine readable medium comprises a plurality of instructions that in response to being executed on a computing device, cause the computing device to carry out any of the methods described herein. An apparatus for processing instructions may be configured to perform the method of any of the methods described herein. And an apparatus may further include means for performing any of the methods described herein.

Embodiments may be implemented in code and may be stored on a machine readable storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further embodiments.

Example 1 includes an apparatus comprising: a monolithic substrate; a memory area, comprising a magnetic tunnel junction (MTJ) that includes a tunnel barrier directly contacting lower and upper MTJ layers, located on the substrate; and a logic area located on the substrate; wherein a horizontal plane, which is parallel to the tunnel barrier, intersects the MTJ, a first Inter-Layer Dielectric (ILD) material adjacent the MTJ, and a second ILD material included in the logic area, the first and second ILD materials being unequal to one another; wherein the first and second ILDs directly contact one another.

In Example 2, the subject matter of Examples 1 can optionally include wherein the upper MTJ layer includes an upper MTJ layer sidewall and the lower MTJ layer includes a lower MTJ sidewall horizontally offset from the upper MTJ layer sidewall by a horizontal offset space that defines a horizontal offset distance.

In Example 3, the subject matter of Examples 1-2 can optionally include a spacer, having a width equal to the horizontal offset distance, directly contacting the upper MTJ layer and the tunnel barrier.

In Example 4, the subject matter of Examples 1-3 can optionally include a hardmask directly contacting an upper surface of the upper MTJ layer and the spacer.

In Example 5, the subject matter of Examples 1-4 can optionally include wherein the horizontal plane intersects etch stop material included between the MTJ and the first ILD material; and the etch stop material is included in an etch stop layer that directly contacts the hardmask.

In Example 6, the subject matter of Examples 1-5 can optionally include wherein the horizontal plane intersects etch stop material included between the MTJ and the first ILD material; and the etch stop material is included in an etch stop layer that directly contacts an upper surface of the spacer.

In Example 7, the subject matter of Examples 1-6 can optionally include wherein the horizontal plane intersects etch stop material included between the MTJ and the first ILD material.

In Example 8, the subject matter of Examples 1-6 can optionally include wherein the etch stop material directly contacts at least one of the tunnel barrier and the lower MTJ layer.

In Example 9, the subject matter of Examples 1-8 can optionally include wherein the etch stop material is included in an etch stop layer having directly connected horizontal and vertical lengths that both directly contact the first ILD.

In Example 10, the subject matter of Examples 1-9 can optionally include wherein the etch stop material is included in an etch stop layer extends from the memory area to the logic area.

In Example 11, the subject matter of Examples 1-10 can optionally include wherein: the first ILD material includes at least one of silicon oxide, silicon oxynitride, porous silicon oxide, fluorinated silicon oxide, carbon-doped oxide, porous carbon-doped oxide, polyimide, polynorbornene, benzocyclobutene, flowable oxide, and polytetrafluoroethylene and the second ILD material includes an additional at least one of silicon oxide, silicon oxynitride, porous silicon oxide, fluorinated silicon oxide, carbon-doped oxide, porous carbon-doped oxide, polyimide, polynorbornene, benzocyclobutene, flowable oxide, and polytetrafluoroethylene; and the first bottom MTJ includes sublayers comprising at least two of tantalum, platinum manganese; cobalt iron; Ruthenium (Ru); and cobalt iron boron.

In Example 12, the subject matter of Examples 1-11 can optionally include wherein the logic area is included in a processor and the memory is spin torque transfer magnetoresistive random access memory (STT-MRAM).

In Example 13, the subject matter of Examples 1-12 can optionally include wherein at least one of the first upper MTJ layer, first lower MTJ layer, and first tunnel barrier includes sublayers.

In Example 14, the subject matter of Examples 1-13 can optionally include the memory area comprises an additional MTJ, having a additional tunnel barrier directly contacting additional lower and upper MTJ layers, located on the substrate; and the horizontal plane intersects the additional MTJ; a contiguous etch stop portion directly contacts both the MTJ and the additional MTJ.

In Example 15, the subject matter of Examples 1-14 can optionally include wherein the contiguous etch stop portion directly contacts the first ILD.

Example 16 includes a method comprising: forming a memory area, comprising a magnetic tunnel junction (MTJ) that includes a tunnel barrier directly contacting lower and upper MTJ layers, on a monolithic substrate; and forming a logic area located on the substrate; wherein a horizontal plane, which is parallel to the tunnel barrier, intersects the MTJ, a first Inter-Layer Dielectric (ILD) material adjacent the MTJ, and a second ILD material included in the logic area, the first and second ILD materials being unequal to one another.

In Example 17, the subject matter of Example 16 can optionally include forming a sidewall of the upper MTJ layer horizontally offset a horizontal offset distance from a sidewall of the lower MTJ layer.

In Example 18, the subject matter of Examples 16-17 can optionally include forming a hardmask directly contacting an upper surface of the upper MTJ layer; and forming a spacer, having a width equal to the horizontal offset distance, in direct contact with the upper MTJ layer and the hardmask.

In Example 19, the subject matter of Examples 16-18 can optionally include forming a spacer, having a width equal to the horizontal offset distance, in direct contact with the upper MTJ layer and the tunnel barrier.

In Example 20, the subject matter of Examples 16-19 can optionally include forming an etch stop layer directly contacting the MTJ and forming the first ILD in direct contact with the etch stop; forming the second ILD in direct contact with the first ILD and the etch stop; and polishing the second ILD while the second ILD is in direct contact with the first ILD.

In Example 21, the subject matter of Examples 16-20 can optionally include forming an etch stop layer directly contacting the MTJ and forming the second ILD in direct contact with the etch stop; forming the first ILD in direct contact with the second ILD and the etch stop; and polishing the first ILD while the first ILD is in direct contact with the second ILD.

Example 22 includes an apparatus comprising: a first magnetic tunnel junction (MTJ) including a first upper MTJ layer, a first lower MTJ layer, and a first tunnel barrier directly contacting a first lower surface of the first upper MTJ layer and a first upper surface of the first lower MTJ layer; a memory area, including the first MTJ, and a logic area form on a monolithic substrate; wherein the first upper MTJ layer includes a first upper MTJ layer sidewall and the first lower MTJ layer includes a first lower MTJ sidewall horizontally offset from the first upper MTJ layer sidewall by a first horizontal offset space that defines a first horizontal offset distance; wherein a first spacer, having a width equal to the first horizontal offset distance, directly contacts the first upper MTJ layer and the first tunnel barrier; wherein a first horizontal plane, parallel to the first lower surface of the first upper MTJ layer, intersects the first MTJ, a first ILD material adjacent the first MTJ, and a second ILD material included in the logic area, the first and second ILD materials being unequal to one another.

In Example 23, the subject matter of Example 22 can optionally include wherein the first horizontal plane intersects a first polish stop material included between the first MTJ and the first ILD material.

In Example 24, the subject matter of Examples 22-23 can optionally include a first hardmask directly contacting a first upper surface of the first upper MTJ layer and the first spacer.

In Example 25, the subject matter of Examples 22-24 can optionally include wherein the first ILD material includes flowable oxide and the second ILD material includes at least one of silicon oxide, porous silicon oxide, fluorinated silicon oxide, carbon-doped oxide, porous carbon-doped oxide, polyimide, polynorbornene, benzocyclobutene, and polytetrafluoroethylene.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a monolithic substrate;
   a memory area, comprising (a) a magnetic tunnel junction (MTJ) that includes a tunnel barrier directly contacting lower and upper MTJ layers, located on the substrate; and (b) an additional MTJ, having an additional tunnel barrier directly contacting additional lower and upper MTJ layers; and
   a logic area located on the substrate;

wherein a horizontal plane, which is parallel to the tunnel barrier, intersects the MTJ and the additional MTJ, a first Inter-Layer Dielectric (ILD) material included in the memory area, and a second ILD material included in the logic area;
wherein the upper MTJ layer includes an upper MTJ layer sidewall and the lower MTJ layer includes a lower MTJ sidewall horizontally offset from the upper MTJ layer sidewall by a horizontal offset space that defines a horizontal offset distance;
wherein a contiguous etch stop portion directly contacts the MTJ and the additional MTJ.

2. The apparatus of claim 1 comprising a spacer, having a width equal to the horizontal offset distance, directly contacting the upper MTJ layer and the tunnel barrier.

3. The apparatus of claim 2 further comprising a hardmask directly contacting an upper surface of the upper MTJ layer and the spacer.

4. The apparatus of claim 1 wherein the horizontal plane intersects the etch stop material.

5. The apparatus of claim 2 wherein the horizontal plane intersects the etch stop material and the etch stop material directly contacts an upper surface of the spacer.

6. The apparatus of claim 1, wherein:
the first ILD material includes at least one of silicon oxide, silicon oxynitride, porous silicon oxide, fluorinated silicon oxide, carbon-doped oxide, porous carbon-doped oxide, polyimide, polynorbornene, benzocyclobutene, flowable oxide, and polytetrafluoroethylene and the second ILD material includes an additional at least one of silicon oxide, silicon oxynitride, porous silicon oxide, fluorinated silicon oxide, carbon-doped oxide, porous carbon-doped oxide, polyimide, polynorbornene, benzocyclobutene, flowable oxide, and polytetrafluoroethylene; and
the first bottom MTJ includes sublayers comprising at least one of tantalum, platinum manganese; cobalt iron; Ruthenium (Ru); and cobalt iron boron.

7. The apparatus of claim 1, wherein the logic area is included in a processor and the memory area includes a memory that is a spin torque transfer magnetoresistive random access memory (STT-MRAM).

8. The apparatus of claim 1, wherein at least one of the first upper MTJ layer, first lower MTJ layer, and first tunnel barrier includes sublayers.

9. The apparatus of claim 1 wherein the contiguous etch stop portion directly contacts the first ILD.

10. The apparatus of claim 1, wherein the first ILD material is adjacent the MTJ, the first and second ILD materials are unequal to one another, and the first and second ILDs directly contact one another.

11. An apparatus comprising:
a monolithic substrate;
a memory area, comprising a magnetic tunnel junction (MTJ) that includes a tunnel barrier directly contacting lower and upper MTJ layers, located on the substrate; and
a logic area located on the substrate;
wherein a horizontal plane, which is parallel to the tunnel barrier, intersects the MTJ, a first Inter-Layer Dielectric (ILD) material included in the memory area, and a second ILD material included in the logic area and unequal to the first ILD material;
wherein the horizontal plane intersects etch stop material included between the MTJ and the first ILD material.

12. The apparatus of claim 11 wherein the etch stop material directly contacts at least one of the tunnel barrier and the lower MTJ layer.

13. The apparatus of claim 11 wherein the etch stop material is included in an etch stop layer having directly connected horizontal and vertical lengths that both directly contact the first ILD material.

14. The apparatus of claim 11 wherein the etch stop material is included in an etch stop layer that extends from the memory area into the logic area.

15. An apparatus comprising:
a first magnetic tunnel junction (MTJ) including a first upper MTJ layer, a first lower MTJ layer, and a first tunnel barrier directly contacting a first lower surface of the first upper MTJ layer and a first upper surface of the first lower MTJ layer;
a memory area, including the first MTJ, and a logic area on a monolithic substrate;
wherein the first upper MTJ layer includes a first upper MTJ layer sidewall and the first lower MTJ layer includes a first lower MTJ sidewall horizontally offset from the first upper MTJ layer sidewall by a first horizontal offset space that defines a first horizontal offset distance;
wherein a first spacer, having a width equal to the first horizontal offset distance, directly contacts the first upper MTJ layer and the first tunnel barrier;
wherein a first horizontal plane, parallel to the first lower surface of the first upper MTJ layer, intersects the first MTJ, a first ILD material adjacent the first MTJ, and a second ILD material included in the logic area, the first and second ILD materials being unequal to one another;
wherein the first horizontal plane intersects a first polish stop material included between the first MTJ and the first ILD material.

16. The apparatus of claim 15 further comprising a first hardmask directly contacting a first upper surface of the first upper MTJ layer and the first spacer.

17. The apparatus of claim 16, wherein the first ILD material includes flowable oxide and the second ILD material includes at least one of silicon oxide, porous silicon oxide, fluorinated silicon oxide, carbon-doped oxide, porous carbon-doped oxide, polyimide, polynorbornene, benzocyclobutene, and polytetrafluoroethylene.

18. An apparatus comprising:
a monolithic substrate;
a memory area, comprising a magnetic tunnel junction (MTJ) that includes a tunnel barrier directly contacting lower and upper MTJ layers, located on the substrate;
a logic area located on the substrate;
a spacer, having a width equal to a horizontal offset distance, directly contacting the upper MTJ layer and the tunnel barrier; and
a hardmask directly contacting an upper surface of the upper MTJ layer and the spacer;
wherein a horizontal plane, which is parallel to the tunnel barrier, intersects the MTJ, a first Inter-Layer Dielectric (ILD) material included in the memory area, and a second ILD material included in the logic area;
wherein the upper MTJ layer includes an upper MTJ layer sidewall and the lower MTJ layer includes a lower MTJ sidewall horizontally offset from the upper MTJ layer sidewall by a horizontal offset space that defines the horizontal offset distance.

19. The apparatus of claim 18, wherein the logic area is included in a processor and the memory area includes a memory that is a spin torque transfer magnetoresistive random access memory (STT-MRAM).

20. The apparatus of claim 18 wherein the horizontal plane intersects etch stop material included between the MTJ and the first ILD material; and the etch stop material is included in an etch stop layer that directly contacts the hardmask.

21. The apparatus of claim 18 wherein the horizontal plane intersects etch stop material included between the MTJ and the first ILD material; and the etch stop material is included in an etch stop layer that directly contacts an upper surface of the spacer.

22. The apparatus of claim 18 comprising etch stop material that directly contacts at least one of the tunnel barrier and the lower MTJ layer.

23. The apparatus of claim 18 comprising etch stop material included in an etch stop layer having directly connected horizontal and vertical lengths that both directly contact the first ILD material.

24. The apparatus of claim 18 comprising etch stop material included in an etch stop layer that extends from the memory area into the logic area.

\* \* \* \* \*